United States Patent [19]

Papworth

[11] 4,327,329

[45] Apr. 27, 1982

[54] ELECTRICAL SIGNAL PROCESSING

[75] Inventor: Derek F. Papworth, Wokingham, England

[73] Assignee: Racal-Dana Instruments Limited, Bracknell, England

[21] Appl. No.: 101,585

[22] Filed: Dec. 10, 1979

[30] Foreign Application Priority Data

Dec. 9, 1978 [GB] United Kingdom ............ 47874/78

[51] Int. Cl.³ .......................... G06G 7/00; G06G 7/12
[52] U.S. Cl. .................................. 328/144; 307/490; 307/529; 328/160
[58] Field of Search ............... 328/144, 160, 132, 145, 328/127, 151; 307/490, 494, 529, 498

[56] References Cited

U.S. PATENT DOCUMENTS

| | | | |
|---|---|---|---|
| 3,614,411 | 10/1971 | Henderson | 328/160 |
| 3,940,703 | 2/1976 | Hekimian et al. | 328/144 |
| 4,242,638 | 12/1980 | Glaser et al. | 328/160 |

*Primary Examiner*—Stanley D. Miller, Jr.
*Assistant Examiner*—B. P. Davis

*Attorney, Agent, or Firm*—Leydig, Voit, Osann, Mayer & Holt, Ltd.

[57] ABSTRACT

A circuit is disclosed which is responsive to an input signal for producing an output signal dependent on its root mean square. The circuit comprises a multiplying circuit for producing a squared signal proportional to the square of the input signal, an averaging circuit responsive to the squared signal to produce an average signal proportional to the mean of the squared signal, and a square root circuit for taking the square root of the average signal. At periodic or aperiodic instants, switches disconnect the input signal and maintain it disconnected each time for a predetermined time duration. A feedback circuit operates during each such duration to produce a feedback signal which exactly offsets any output still produced by the multiplying circuit during that duration due to noise or drift. Any such feedback signal is stored between the predetermined durations and applied as a correcting signal to the output of the multiplying circuit. Also disclosed is one particular form which the multiplying circuit can take.

15 Claims, 2 Drawing Figures

ELECTRICAL SIGNAL PROCESSING

BACKGROUND OF THE INVENTION

The invention relates to electrical circuit arrangements and more particularly to electrical signal processing arrangements. One such circuit arrangement to which the invention relates is a circuit arrangement for producing an output representative of the root mean square (RMS) value of an electrical input signal, and another such circuit arrangement to which the invention relates is for multiplying electrical signals together.

Electrical circuit arrangements for producing an output representative of the RMS value of an input signal are known. Such known forms of circuit arrangement may comprise various forms in which a squaring circuit receives an input signal and squares it, an averaging circuit then produces an average signal proportional to the sum of the squared signal, and a square root circuit then takes the square root of the average signal to produce the required RMS output.

Such circuit arrangements often have application in high precision measurements and a disadvantage of known circuit arrangements is that they are susceptible to errors resulting from noise and/or drift.

An object of the invention is an improved electrical circuit arrangement for producing an output signal dependent on the root mean square value of an input signal.

A more specific object of the invention is such a circuit arrangement which is capable of high accuracy by correcting for errors due to noise and/or drift.

A further object of the invention is an improved electrical multiplying circuit which may be used as the squaring circuit in a circuit arrangement for producing the RMS value of an input signal, though it is not limited to such application and may be used in other applications.

BRIEF SUMMARY OF THE INVENTION

According to the invention, there is provided an electrical circuit arrangement responsive to an input signal for producing an output signal dependent on its root mean square value, comprising squaring means responsive to the input signal for producing a squared signal proportional to the square of the input signal, averaging means responsive to the squared signal to produce an average signal proportional to the mean of the squared signal, means for taking the square root of the average signal to produce the said output signal, switching means operative at spaced time instants to disconnect the input signal from the squaring means and to maintain it disconnected each time for a predetermined duration, feedback means operative when the input signal is so disconnected to produce a feedback signal of such polarity and magnitude as substantially to offset any output produced by the squaring means during that predetermined duration, and means for storing that feedback signal between the said predetermined durations and applying it as a correcting signal to the output of the squaring means.

According to the invention, there is also provided an electrical multiplying circuit arrangement, comprising first and second transistors connected together such that their respective conductions vary in opposite directions in response to changes in a first signal (X1−X2) applied between first and second input terminals, and third and fourth transistors respectively connected in parallel so that their respective conductions vary together in response to change in a second signal (Y1−Y2) applied between third and fourth input terminals, the third and fourth transistors being respectively connected to the first and second transistors so that the gains of the third and forth transistors are varied by the conductions through the first and second transistors respectively whereby the difference between the conductions of the third and fourth transistors is dependent on the product of the first and second signals, the collector of the third transistor being connected to the first transistor, and the collector of the fourth transistor being connected to the second transistor, and the third and fourth transistors being biased so that when the second signal is zero changes in their conductions due to changes in their gains resulting from changes in the first signal are substantially balanced by the changes in conductions through the collectors of the first and second transistors.

BRIEF DESCRIPTION OF THE DRAWINGS

Electrical circuit arrangements embodying the invention will now be described with reference to the accompanying drawings in which.

DESCRIPTION OF PREFERRED EMBODIMENTS

Figure 1:
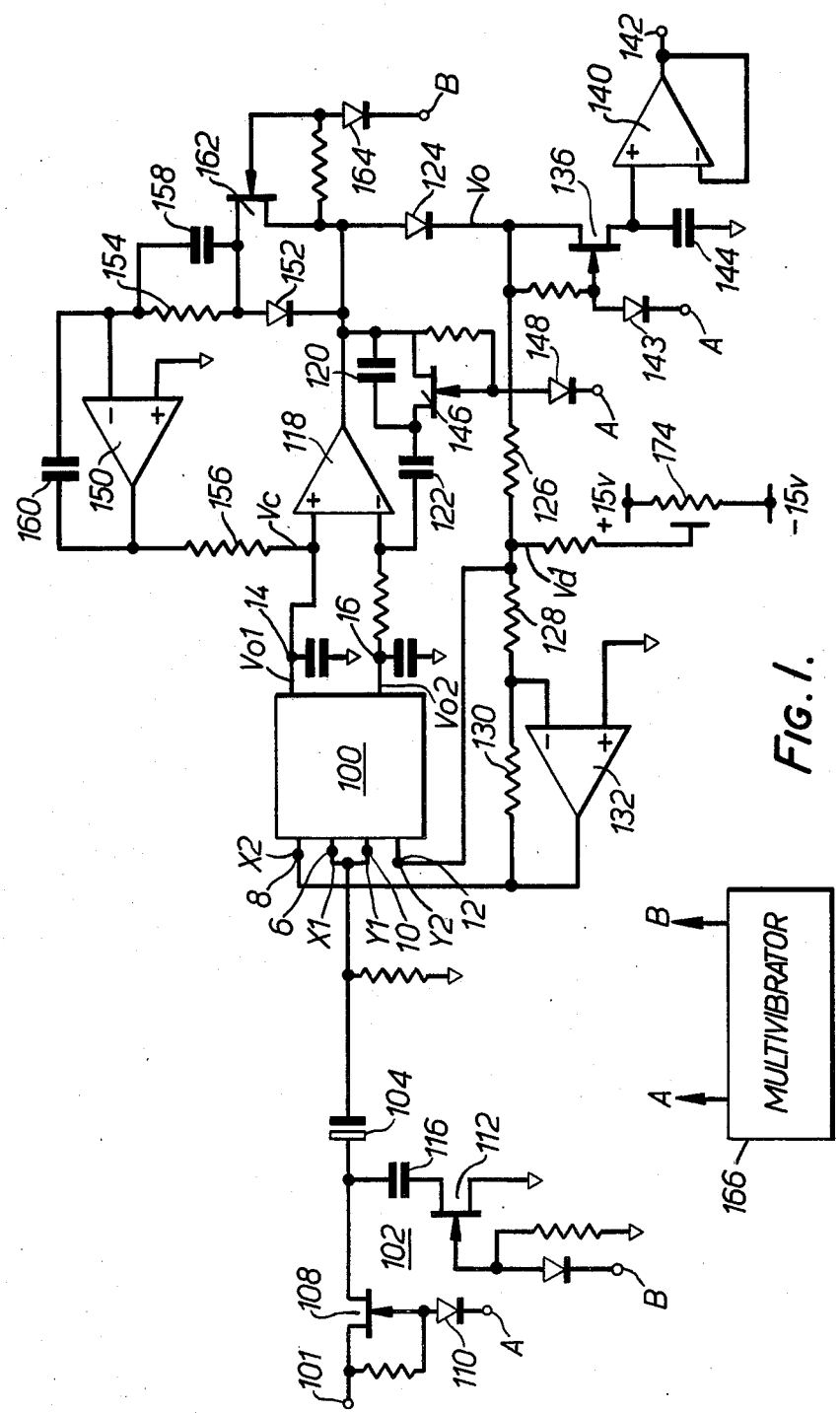
FIG. 1 is a circuit diagram of one of the circuit arrangements which is connected to receive an electrical input signal and to produce an output representative of its root mean square value.

The circuit arrangement of FIG. 1 incorporates a multiplying circuit 100. This circuit has two pairs of input terminals 6, 8 and 10, 12 and is arranged such that when a signal (X1−X2) is applied between terminals 6 and 8 and a signal (Y1−Y2) is applied between terminals 10 and 12, the circuit produces an output representing the product (X1−X2).(Y1−Y2), this output being produced as a signal (Vo1−Vo2) appearing between terminals 14 and 16.

The multiplying circuit may take any suitable known form, having differential inputs, for example a transconductance multiplier of the Gilbert cell type, but should have a high speed in relation to the operating speed of the rest of the circuit. Instead of having a known form, however, it may, for example, take the form of the circuit arrangement embodying the invention which will be described below with reference to FIG. 2.

Referring to FIG. 1, the input voltage whose root mean square (RMS) is to be measured is applied to an input terminal 101. The input voltage may, purely as an example, be in the range up to 100 mV (RMS). Terminal 101 is connected through a series-shunt switch arrangement 102 and a capacitor 104 to the input terminals 6 and 10 of the multiplying circuit 100.

Switch 102 comprises a series field effect transistor (FET) 108 whose conduction is controlled by a signal applied to its gate via a terminal A and a diode 110, and a shunt FET 112 whose conduction is controlled by a signal applied to its gate via a terminal B and a diode 114. The input line 101 is connected to the FET 112 through a capacitor 116.

The outputs Vo1 and Vo2 of the block 100 at terminals 14 and 16 are connected to the positive and negative inputs of a differential amplifier 118 which acts as an integrator, having an integrating capacitor 122 connected across it in series with a further capacitor 120. The output of the amplifier 118 is connected, via a diode 124 and a resistor 126 to the input terminal 12 of the block 100. This signal is also applied via a resistor 128 to the negative input of an amplifier 132 which is shunted by a resistor 130 and is connected to act as a unity gain inverter and which supplies the terminal 8 of the block 100.

The output from amplifier 118 is also connected, via the diode 124 and an FET 136, to an output amplifier 140 which feeds the overall output terminal 142 of the circuit arrangement.

Conduction of the FET 136 is controlled by a signal applied to its gate via a terminal A and a diode 143. The signal applied to the amplifier 140 by the FET is applied across a storage capacitor 144.

The integrating capacitor 120 of the amplifier 118 is shunted by a further FET 146 whose conduction is controlled by a signal applied to its gate via a terminal A and a diode 148.

The amplifier 118 has a further feedback path comprising an inverting amplifier 150 which is connected across the amplifier via diode 152, a resistor 154 and a resistor 156. Resistor 154 is shunted by a capacitor 158, and a similar capacitor 160 shunts the amplifier 150 to make it act as an integrator.

The diode 152 is shunted by an FET 162 whose conduction is controlled by a signal applied to its gate by a terminal B and a diode 164.

Control signals for the terminals A (which are all connected together) and the terminals B (which are also all connected together) of all the FET's are provided by a multivibrator 166. This has two output terminals A and B. Normally, output terminal A is held at positive and output terminal B is held at negative, and the biasing of the FET's is such that FET's 108, 136 and 146 are conductive while FET's 112 and 162 are non-conductive. However, at the end of each one second period, the multivibrator switches its output terminal A negative, and simultaneously switches its output terminal B positive and holds these respective negative and positive levels for a one millisecond duration. Therefore, during each one of these one millisecond durations, FET's 108, 136 and 146 are rendered non-conductive and FET's 112 and 162 are rendered conductive.

The operation will initially be considered under the condition when the output terminals A and B of the multivibrator are held positive and negative respectively.

Therefore, the input signal at the terminal 101 is applied to the terminals 6 and 10 of the block 100 which consequently produces an output (Vo1−Vo2) dependent on the square of the input voltage. This is because the output Vo1−Vo2 will be equal to the product of X1 and Y1 if the input supplied to terminals 8 and 12 of the block 100 is ignored for the time being where X1 is the signal applied to terminal 6 and Y1 is the signal applied to terminal 10.

Amplifier 118, being connected as an integrator, produces an output dependent on the average or mean of the square of the input signal. This output is applied as the signal Y2 to the terminal 12 of the block 100 and, after inversion, as the signal X2 to the terminal 8. Therefore, the outputs Vo1 and Vo2 of the block 100 are modified by the product X2·Y2.

Thus, $$Vo1 - Vo2 = (X1 - X2) \cdot (Y1 - Y2) \qquad (1)$$

but $$X2 = -Vo$$

where Vo is the output of amplifier 118 (because of the inverting action of amplifier 132), $$Y2 = +Vo, \text{ and}$$

$$X1 = Y1 = Vi,$$

where Vi is the input signal at terminal 101. Substituting in Equation (1), $$Vo1 - Vo2 = (Vi + Vo) \cdot (Vi - Vo) \qquad (2)$$
$$= (Vi^2 - Vo^2)$$

Now
$$Vo = A\overline{(Vo1 - Vo2)},$$
where A is the gain of amplifier 118. Therefore, $$\overline{(Vo1 - Vo2)} = Vo/A$$

If A tends to infinity, then $\overline{(Vo1-Vo2)}$ tends to zero. Thus, substituting in Equation (2), $$\overline{(Vo1-Vo2)} = 0 = \overline{(Vi^2 - Vo^2)}$$

Therefore, $$\overline{Vo^2} = \overline{Vi^2}$$

So, $$Vo = \sqrt{\overline{Vi^2}}$$

In this way, therefore, the output Vo produced via the diode 124 by the amplifier 118 is proportional to the root mean square of the input voltage, and the need for a separate circuit to take the square root of the amplifier output is avoided.

This root mean square output is then applied to the output terminal 142 by the amplifier 140.

The circuit arrangement also has an automatic zeroing and automatic noise-cancelling capability. This is carried out under control of the multivibrator 166.

As explained, at the end of every one second period, the multivibrator 166 renders its output A negative and its output B positive (for a one millisecond duration). Therefore, the FET's 108, 136 and 146 are rendered non-conductive, and simultaneously the FET's 112 and 162 are rendered conductive. This has the effect of isolating the input terminal 101 from the block 100. At the same time, the output of amplifier 118 is disconnected from the output amplifier 140. The output at terminal 142 is, however, held at its previous level by the storage capacitor 144.

At the same time, the integrating capacitor 122 across amplifier 118 is disconnected and the amplifier acts no longer as an integrator. Capacitor 120 in series with 122 remains, to avoid instability. In addition, FET 162 short-circuits diode 152 and the feedback path incorporating amplifier 150 becomes effective.

During the one millisecond period, therefore, the amplifier 118 will produce an output which, in view of the fact that the input terminal 101 is disconnected from the block 100, will be dependent only on any noise in the circuit arrangement and on any spurious signals arising as a result of drift. Any such output is amplified and averaged by the amplifier 150 and fed back in such a sense as to produce an output which is fed to the positive terminal of amplifier 118 and is of such polarity and magnitude as to reduce the output of amplifier 118 to zero. The signal required to produce this zeroing is stored on capacitor 160. Capacitor 158 provides phase correction to stabilise the feedback loop.

At the end of the one millisecond period, the FET's are all switched back to their previous states and the circuit recommences measuring the RMS value of the input at terminal 101.

In this way, once every second, the circuit arrangement is adjusted as necessary to bring the output to zero with zero input, and any necessary correcting signal is maintained and is effective throughout the following one second period.

The correction action described not only eliminates drift but also eliminates noise. This is because averaging action of the amplifier 150 eliminates all alternating noise components (which sum to zero), leaving only a mean square (d.c.) noise term—which is cancelled (along with the zero drift) by the correcting signal produced at the output of amplifier 150. This is shown in the following mathematical analysis.

In the following analysis, the input signal applied to terminals 6 and 10 of block 100 is assumed to be $(Vs+Vn)$ where Vs is due to the signal applied to terminal 101 and Vn is the noise generated within the circuit arrangement. It is also assumed that signals Vzx and Vzy arise at terminals 6 and 10 respectively, due to zero drift. The correcting action produced by the amplifier 150 during the one millisecond correction above will be assumed to produce a correcting signal Vc at the input of amplifier 118 and a potentiometer 174 will produce a correcting signal Vd at its output.

Therefore, from Equation (1) above, $$Vo1-Vo2=[(Vs+Vn+Vzx)+(Vo+Vd)] \cdot [(Vs+Vn+Vzy)-(Vo+Vd)] \quad (3)$$

Let $$(Vzx+Vzy)/(2)=Va, \quad (4)$$

$$(Vzx-Vzy)/(2)=Vb \text{ and} \quad (5)$$

$$Vo1-Vo2=Vm. \text{ Then,} \quad (6)$$

$$Vzx+Vzy=2Va, \text{ and}$$

$$Vzx-Vzy=2Vb.$$

Summing, $$2Vzx=2(Va+Vb) \text{ and}$$

$$2Vzy=2(Va-Vb).$$

Therefore, $$Vzx=(Va+Vb) \text{ and} \quad (7)$$

$$Vzy=(Va-Vb) \quad (8)$$

Substituting from Equations (6), (7) and (8) in Equation (3), $$\begin{aligned}
\overline{Vm} &= \overline{[(Vs+Vn+Va+Vb)+(Vo+Vd)] \cdot} \\
&\quad \overline{[(Vs+Vn+Va-Vd)-(Vo+Vd)]} \\
&= \overline{[(Vs+Vn+Va)+(Vo+Vb+Vd)] \cdot} \\
&\quad \overline{[(Vs+Vn+Va)-(Vo+Vb+Vd)]} \\
&= \overline{(Vs+Vn+Va)^2-(Vo+Vb+Vd)^2}.
\end{aligned} \quad (9)$$

But $Vo=A(\overline{Vm+Vc})$

Therefore $(\overline{Vm+Vc})=(Vo)/(A)$

If A tends to infinity, $$\overline{Vm}=-\overline{Vc}$$

Substituting in Equation (9), $$-\overline{Vc}=\overline{(Vs+Vn+Va)^2}-\overline{(Vo+Vb+Vd)^2}$$

So, $$\begin{aligned}
\overline{(Vo+Vb+Vd)^2} &= \overline{(Vs+Vn+Va)^2}+\overline{Vc} \\
&= \overline{Vs^2+2Vs(Vn+Va)+(Vn+Va)^2}+\overline{Vc} \\
&= \overline{Vs^2+2Vs(Vn+Va)+Vn^2+2Vn \cdot Va+Va^2}+\overline{Vc}
\end{aligned}$$

But Vs and Vn are alternating signals and their mean values are zero. Therefore, $$\overline{(Vo+Vb+Vd)^2}=\overline{(Vs^2+Vn^2+Va^2+Vc)} \quad (10)$$

If Vd is made equal to $$-Vb=-\frac{(Vzx-Vzy)}{2}$$

and Vc is made equal to $-(Vn^2+Va^2)$, that is, to $$\left[(Vn^2)+\left(\frac{Vzx+Vzy}{2}\right)^2\right].$$

then, substituting in Equation (10), $$\overline{Vo^2}=\overline{Vs^2}, \text{ or}$$

$$Vo=\sqrt{\overline{Vs^2}},$$

the RMS value of the signal applied to terminal 101. Therefore, the zero error due to Vn and to the input offset Vzx and Vzy is removed by Vc, and the output offset due to Vzx and Vzy, producing non-linearity, is removed by Vd.

The signal Vc is generated at the end of every second in the manner explained, and stored during the following second by the capacitor 160. The capacitor 144 stores the circuit output during the one millisecond duration when the signal Vc is being produced. The fact that the output 142 is effectively disconnected from the input of the circuit arrangement for one millisecond every one second will produce a small reduction in accuracy, but this is more than compensated for by the reduction of error due to noise and drift.

As indicated above, adjustment of the voltage Vd corrects for any non-linearity of the measurement due to Vzx−Vzy. This does not, however, affect the auto zeroing action of the circuit arrangement.

To avoid possible large errors with pulse input signals having a repetition frequency synchronous with that of the multivibrator 166, the latter may be arranged to have a pseudorandom or random frequency.

The capacitor 104 may be removed so that the signal input is D.C. coupled if required, thus giving an RMS output of the total A.C. and D.C. input.

Amplification, A.C. or D.C. coupled may be interposed between switch 102 and the input terminals 6 and 10, and the noise and drift cancellation will then operate on any noise or drift in such amplification (as well, of course, as elsewhere downstream of the switch 108).

Figure 2:
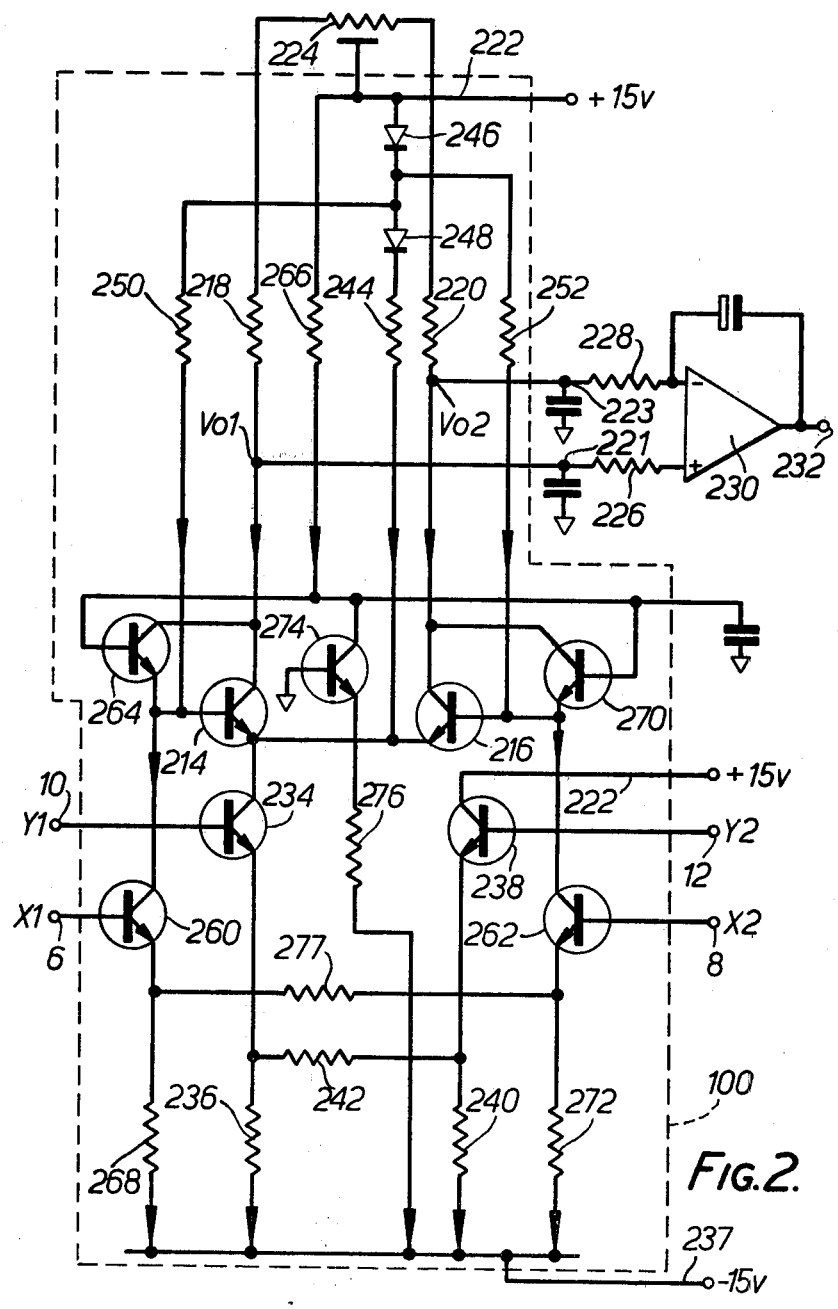
FIG. 2 is a circuit diagram of another of the circuit arrangements, which may be incorporated in the circuit arrangement of FIG. 1, and which is for multiplying electrical signals together.

The circuit arrangement now to be described with reference to FIG. 2 may be used as the block 100 in FIG. 1. However, it may of course be used in any other applications where there is a requirement for multiplying together two electrical signals (X1−X2) and (Y1−Y2). Parts in FIG. 2 corresponding to parts in FIG. 1 are similarly referenced.

The circuit arrangement of FIG. 1 has the pair of input terminals 6 and 8 between which signal (X1−X2) is applied and the two further input terminals 10 and 12 between which signal (Y1−Y2) is applied. Terminals 10 and 12 control the conduction of two transistors 214 and 216 which are connected together as a long tailed pair to form a first, balanced, channel. As shown, the transistors 214 and 216 have respective collector resistors 218 and 220 which are supplied with a +15 volts supply from a line 222 via an adjustable tapping on a resistor 224. The output voltages Vo1 and Vo2 which are respectively developed across the resistors 218 and 220, and appear at terminals 221 and 223, are fed through resistors 226 and 228 to the positive and negative inputs of a differential amplifier 230 (corresponding to amplifier 118 in FIG. 1). The amplifier 230 has an output terminal 232 and when the conduction of the transistors 214 and 216 is equal, the output at this terminal will be zero.

The transistors 214 and 216 have their emitters connected together and to the collector of a transistor 234 whose base is connected to the terminal 10. Transistor 234 has an emitter resistor 236 connected to a −15v line 37. Terminal 12 is connected to the base of a further transistor 238 whose collector is connected to the +15v supply line 222 and which has an emitter resistor 240. A resistor 242 connects the emitters of the transistors 234 and 238 together.

Therefore, when the signal (Y1−Y2) is applied between terminals 10 and 12, the conduction of the transistors 214 and 216 will vary equally with variations in (Y1−Y2).

Additional current is supplied to transistor 234 collector by a resistor 244 which is connected to the line 222 through two diodes 246 and 248. This allows the transistors 234 and 238 to operate at a relatively small current swing at maximum signal input, thus ensuring a low signal distortion level.

The second channel of the circuit arrangement, for handling the signal (X1−X2), comprises two transistors 260 and 262 whose bases are respectively connected to terminals 6 and 8. The collector-emitter path of transistors 260 is connected in series with the base-emitter diode of a transistor 264 via a resistor 266, (connected to the +15v supply line 222), and a resistor 268. Similarly, the collector-emitter path of transistor 262 is connected in series with the base-emitter diode of a further transistor 270 via the resistor 266 and a resistor 272.

The bias for the transistors 264 and 270 is set by a transistor 274 whose base is grounded and whose emitter is connected to the line 237 via a resistor 276.

The collector of transistor 264 is connected to the transistor 214, and the collector of transistor 270 is connected to the collector of transistor 216.

The biasing of transistors 264 and 270 is such that their respective base-emitter diodes are set, when the circuit arrangement is quiescent, to operating points on exponential parts of their characteristics. The emitters of the transistors 260 and 262 are connected by a resistor 277. Therefore, when a signal (X1−X2) is applied between terminals 6 and 8, the conduction through the transistors 264 and 270 will vary in opposite directions with variations in (X1−X2).

Additional current is supplied to the collectors of transistors 260 and 262 (by resistors 250 and 252 respectively) which connect to the junction between the series-connected diodes 246 and 248. This allows the transistors 260 and 262 to operate at a relatively small current swing at maximum signal input, thus ensuring a low signal distortion level.

The bases of transistors 214 and 216 are respectively connected to the emitters of transistors 264 and 270. Thus, when a signal (Y1−Y2) is applied between terminals 10 and 12 and a signal (X1−X2) is applied between terminals 6 and 8, the conduction of transistors 214 and 216 will depend not only on the value of the signal (Y1−Y2) which will vary the gains of the transistors 214 and 216, but also on the value of the signal (X1−X2), and the changes in conduction of the transistors 214 and 216 will be in opposite directions and dependent on the product (X1−X2)·(Y1−Y2). There will therefore be corresponding changes in Vo1 and Vo2, and an output change will appear at terminal 232 proportional to the product (X1−X2)·(Y1−Y2).

If the signal (X1−X2) is zero, then both transistors 214 and 216 will conduct equally, and there will therefore be no output at terminal 232 irrespective of the value of the signal (Y1−Y2)—because a change in (Y1−Y2) merely has the effect of varying the currents of transistors 214 and 216 equally. In order to ensure that there is also zero output at terminal 232, when (X1−X2) is finite and (Y1−Y2) is zero, the collectors of the transistors 264 and 270 are respectively connected to the collectors of the transistors 214 and 216. The currents in transistors 214 and 216 when (Y1−Y2) is zero are made such that any change between these currents due to (X1−X2) having a finite value and affecting the gains of transistors 214 and 216 is balanced by an alteration in the currents which flow through the collectors of transistors 264 and 270 and the collector load resistors 218 and 220 of the transistors 214 and 216. Therefore, again the output at terminal 232 is zero.

The adjustable tapping on the resistor 224 enables the two circuit paths of the channel incorporating the transistors 214 and 216 to be balanced. When the multiplying circuit is used as the block 100 in FIG. 1, adjustment of the tapping is used to centralise the operating point of amplifier 150.

What is claimed is:

1. An electrical circuit arrangement responsive to an input signal for producing an output signal dependent on its root mean square value, comprising
squaring means responsive to the input signal for producing a squared signal proportional to the square of the input signal,
averaging means connected to receive the squared signal to produce an average signal proportional to the mean of the squared signal,
means connected to receive the average signal to take the square root of the average signal to produce the said output signal,
switching means operative at spaced time instants to disconnect the input signal from the input of the squaring means and to maintain it disconnected each time for a predetermined duration,
feedback means connected to the output of the squaring means and operative when the input signal is disconnected from the input of the squaring means to produce a feedback signal of such polarity and magnitude as substantially to null any output produced by the squaring means during that predetermined duration,
storage means connected to receive the feedback signal during each said predetermined duration and to store it from the end of that duration until the next following predetermined duration, and
means connected to apply the stored feedback signal to the output of the squaring means between those said predetermined durations so as to tend to continue to offset any output produced by the squaring means between those durations.

2. An electrical circuit arrangement responsive to an input signal for producing an output signal dependent on its root mean square value, comprising
squaring means comprising a multiplying circuit having inputs respectively connected to receive signals X1, X2, Y1 and Y2 and arranged to produce a product output dependent on the product (X1−X2). (Y1−Y2), the input signal being connected to the X1 and Y1 inputs,
averaging means connected to receive the said product output and to average it,
means feeding to the X2 and Y2 inputs of the multiplying circuit signals respectively equal to the output of the averaging means and equal to the inverse of that output, the averaging means having a gain which is sufficiently high that its output is proportional to the root mean square of the input signal and is the said output signal, and
switching means operative at spaced time instants to disconnect the input signal from the input of the squaring means and to maintain it disconnected each time for a predetermined duration,
feedback means connected to the output of the squaring means and operative when the input signal is disconnected from the input of the squaring means to produce a feedback signal of such polarity and magnitude as substantially to null any output produced by the squaring means during that predetermined duration,
storage means connected to receive the feedback signal during each said predetermined duration and to store it from the end of that duration until the next following predetermined duration, and
means connected to apply the stored feedback signal to the output of the squaring means between those said predetermined durations so as to tend to continue to offset any output produced by the squaring means between those durations.

3. A circuit arrangement according to claim 1 or 2, in which the feedback means includes second averaging means for averaging variations in any output produced by the squaring means during each said predetermined duration so that the feedback signal is independent of alternating components in the output from the squaring means which are dependent on noise and substantially offsets d.c. components due to noise and zero drift.

4. A circuit arrangement according to claim 3, in which the first-mentioned averaging means comprises an amplifier and a capacitor connected across the amplifier to render it operative as an integrating amplifier.

5. A circuit arrangement according to claim 4, in which the feedback means comprises means arranged to temporarily disconnect the capacitor of the first-mentioned averaging means during the said predetermined durations and a second integrating amplifier and means operative only during each said predetermined duration to connect the second integrating amplifier in a negative feedback sense across the first-mentioned averaging means.

6. A circuit arrangement according to claim 5, in which the means for storing the feedback signal comprises a capacitor connected across the second integrating amplifier.

7. A circuit arrangement according to claim 1 or 2, including second storage means connected to temporarily store, for the length of each predetermined duration, the value of the output signal immediately before the start of that duration and including means presenting the stored signal as the output signal during that duration.

8. A circuit arrangement according to claim 1 or 2, including means connected to operate the switching means randomly or pseudo-randomly.

9. A circuit arrangement according to claim 1 or 2, in which the switching means comprises a plurality of field effect transistors and multi-vibrator means connected to control the conductions of the field effect transistors.

10. An electrical multiplying circuit arrangement, comprising
first and second transistors connected together,
first and second input terminals connected to the first and second transistors such that their respective conductions vary in opposite directions in response to changes in a first signal (X1−X2) applied between the first and second input terminals,
third and fourth transistors,
third and fourth terminals connected to the third and fourth transistors and means connecting the third and fourth transistors in parallel so that their respective conductions vary together in response to a change in a second signal (Y1−Y2) applied between the third and fourth input terminals,
means connecting the third and fourth transistors to the first and second transistors so that the gains of the third and fourth transistors are varied by the conductions through the first and second transistors respectively whereby the difference between the conductions of the third and fourth transistors is dependent on the product of the first and second signals,
means connecting the collector of the third transistor to the first transistor, means connecting the collector of the fourth transistor to the second transistor, and means biasing the third and fourth transistors so that when the second signal is zero changes in their conductions due to changes in their gains resulting from changes in the first signal are substantially balanced by the changes in conductions through the collectors of the first and second transistors.

11. A circuit arrangement according to claim 10, including means connecting the collector circuits of the third and fourth transistors in parallel, each collector circuit including a respective collector load across which first and second outputs are taken in dependence on the said product, a fifth transistor, a sixth transistor, and means connecting the third and fourth terminals to the bases of the fifth and sixth transistors and connecting the emitters of the third and fourth transistors together and in series with the collector-emitter path of the fifth transistor and coupling the fifth and sixth transistors together so that variation of the second signal varies the conductions equally of the third and fourth transistors.

12. A circuit arrangement according to claim 11, including seventh and eighth transistors which have coupled emitters, means connecting the first and second transistors respectively in series with the collector-emitter paths of the seventh and eighth transistors, whereby variation of the first signal varies in opposite directions the conductions through the seventh and eighth transistors, and consequently through the base-emitter diodes of the first and second transistors, when the second signal is applied between the bases of the seventh and eighth transistors.

13. A circuit arrangement according to claim 11, including a differential amplifier, and means connecting the first and second outputs to the opposite polarity inputs of the differential amplifier.

14. An electrical circuit arrangement responsive to an input signal for producing an output signal dependent on its root mean square value, comprising squaring means responsive to the input signal for producing a squared signal proportional to the square of the input signal, averaging means responsive to the squared signal to produce an average signal proportional to the mean of the squared signal, means for taking the square root of the average signal to produce the said output signal, switching means operative at spaced time instants to disconnect the input signal from the input of the squaring means and to maintain it disconnected each time for a predetermined duration, feedback means connected to the output of the squaring means and operative when the input signal is disconnected from the squaring means to produce a feedback signal of such polarity and magnitude as substantially to offset any output produced by the squaring means during that predetermined duration, and means for storing that feedback signal between the said predetermined durations and applying it as a correcting signal to the output of the squaring means, the squaring means comprising a multiplying circuit according to claim 10, and including means connecting the input signal between the first and third input terminals of the multiplying circuit, the means for taking the square root of the said average signal comprising means for feeding to the second and fourth input terminals of the multiplying circuit signals respectively equal to the output of the averaging means and equal to the inverse of that output, the averaging means having a gain which is sufficiently high that its output is proportional to the root mean square of the input signal.

15. A circuit arrangement according to claim 1 or 2, including means producing a constant correction signal and means feeding the constant correction signal to the input of the squaring means to offset nonlinearities in the output thereof.

* * * * *